United States Patent
Park et al.

(10) Patent No.: US 7,115,508 B2
(45) Date of Patent: Oct. 3, 2006

(54) OXIDE-LIKE SEASONING FOR DIELECTRIC LOW K FILMS

(75) Inventors: Sohyun Park, Santa Clara, CA (US); Wen H. Zhu, Sunnyvale, CA (US); Tzu-Fang Huang, San Jose, CA (US); Li-Qun Xia, Santa Clara, CA (US); Hichem M'Saad, Santa Clara, CA (US)

(73) Assignee: Applied-Materials, Inc., Santa Clara, CA (US)

( * ) Notice: Subject to any disclaimer, the term of this patent is extended or adjusted under 35 U.S.C. 154(b) by 243 days.

(21) Appl. No.: 10/816,606

(22) Filed: Apr. 2, 2004

(65) Prior Publication Data
US 2005/0227499 A1    Oct. 13, 2005

(51) Int. Cl.
  *H01L 21/44* (2006.01)
  *H01L 21/31* (2006.01)
(52) U.S. Cl. .................. 438/680; 438/778; 438/913
(58) Field of Classification Search ................ 438/680, 438/778, 913
See application file for complete search history.

(56) References Cited

U.S. PATENT DOCUMENTS

| | | | |
|---|---|---|---|
| 5,811,356 A | 9/1998 | Murugesh et al. | |
| 5,812,403 A | 9/1998 | Fong et al. | |
| 5,824,375 A | 10/1998 | Gupta | |
| 5,855,681 A | 1/1999 | Maydan et al. | |
| 5,911,834 A | 6/1999 | Fairbairn et al. | |
| 6,054,206 A | 4/2000 | Mountsier | |
| 6,056,823 A | 5/2000 | Sajoto et al. | |
| 6,068,884 A | 5/2000 | Rose et al. | |
| 6,121,161 A * | 9/2000 | Rossman et al. | 438/783 |
| 6,147,009 A | 11/2000 | Grill et al. | |
| 6,159,871 A | 12/2000 | Loboda et al. | |
| 6,224,681 B1 | 5/2001 | Sivaramakrishnan et al. | |
| 6,449,521 B1 | 9/2002 | Gupta | |
| 6,518,646 B1 | 2/2003 | Hopper et al. | |
| 6,521,302 B1 | 2/2003 | Campana-Schmitt et al. | |
| 6,527,865 B1 | 3/2003 | Sajoto et al. | |
| 6,570,256 B1 | 5/2003 | Conti et al. | |
| 6,593,247 B1 | 7/2003 | Huang et al. | |
| 6,627,532 B1 | 9/2003 | Gaillard et al. | |
| 6,656,837 B1 | 12/2003 | Xu et al. | |
| 6,846,742 B1 * | 1/2005 | Rossman | 438/680 |

(Continued)

FOREIGN PATENT DOCUMENTS

EP        0884401 A1 *   4/1998

OTHER PUBLICATIONS

U.S. Appl. No. 10/801,190, filed Mar. 15, 2004 (AMAT/8670).

(Continued)

*Primary Examiner*—David S. Blum
(74) *Attorney, Agent, or Firm*—Patterson and Sheridan

(57) ABSTRACT

A method for seasoning a chamber and depositing a low dielectric constant layer on a substrate in the chamber is provided. In one aspect, the method includes seasoning the chamber with a first mixture comprising one or more organosilicon compounds and one or more oxidizing gases and depositing a low dielectric constant layer on a substrate in the chamber from a second mixture comprising one or more organosilicon compounds and one or more oxidizing gases, wherein a ratio of the total flow rate of the organosilicon compounds to the total flow rate of the oxidizing gases in the first mixture is lower than the total flow rate of the organosilicon compounds to the total flow rate of the oxidizing gases in the second mixture.

14 Claims, 3 Drawing Sheets

U.S. PATENT DOCUMENTS

| | | |
|---|---|---|
| 6,849,561 B1 | 2/2005 | Goundar |
| 2002/0054962 A1 | 5/2002 | Huang |
| 2002/0146512 A1 | 10/2002 | Rossman |
| 2002/0163637 A1 | 11/2002 | Rossman et al. |
| 2003/0008517 A1 | 1/2003 | Ko et al. |
| 2003/0017642 A1 | 1/2003 | Conti et al. |
| 2005/0026422 A1 | 2/2005 | Kim et al. |
| 2006/0093756 A1* | 5/2006 | Rajagopalan et al. ....... 427/569 |

OTHER PUBLICATIONS

U.S. Appl. No. 10/383,837, filed Mar. 7, 2003 (AMAT/7838).

* cited by examiner

OXIDE-LIKE SEASONING FOR DIELECTRIC LOW K FILMS

BACKGROUND OF THE INVENTION

1. Field of the Invention

Embodiments of the present invention generally relate to the fabrication of integrated circuits. More particularly, embodiments of the invention relate to a method of seasoning a chamber and depositing a low dielectric constant layer in the chamber.

2. Description of the Related Art

In the fabrication of integrated circuits and semiconductor devices, materials such as oxides, e.g., carbon-doped oxides, are typically deposited on a substrate in a processing chamber, such as a deposition chamber, e.g., a chemical vapor deposition (CVD) chamber. The deposition processes typically result in deposition of some of the material on the walls and components of the deposition chamber. The material deposited on the chamber walls and components can affect the deposition rate from substrate to substrate and the uniformity of the deposition on the substrate. The material deposited on the chamber walls and components can also detach from the chamber components and create contaminating particles that can damage or destroy semiconductor devices.

Particle contamination within the chamber is typically controlled by periodically cleaning the chamber using cleaning gases, typically fluorinated compounds, that are excited by inductively or capacitively coupled plasmas. Cleaning gases are selected based on their ability to bind the precursor gases and the deposited material formed on the chamber components in order to form volatile products which can be exhausted from the chamber, thereby cleaning the process environment of the chamber.

Once the chamber has been sufficiently cleaned of the process gases and the cleaning by-products have been exhausted out of the chamber, a seasoning step is performed to deposit a film onto components of the chamber forming the processing region to seal remaining contaminants therein and reduce the contamination level during processing. This step is typically carried out by depositing a seasoning film to coat the interior surfaces forming the processing region in accordance with the subsequent deposition process recipe.

Typically, seasoning films have been deposited in deposition chambers using gas mixtures identical to the gas mixtures used in the deposition processes performed in the chamber after chamber seasoning. However, it has been found that seasoning films deposited from gas mixtures have identical components in identical ratios to the gas mixtures used in subsequent deposition processes, such as the deposition of carbon doped oxides, can crack or peel off from the interior surfaces of the deposition chamber, creating contaminating particles in the chamber.

Therefore, there remains a need for a method of seasoning a deposition chamber in which the formation of contaminating particles from the seasoning film is minimized.

SUMMARY OF THE INVENTION

The present invention generally provides a method for seasoning a chamber and depositing a low dielectric constant layer on a substrate in the chamber. The chamber is seasoned by depositing a seasoning layer in the chamber under conditions sufficient to minimize the generation of contaminating particles from the seasoning layer.

In one embodiment, a method for seasoning a chamber and depositing a low dielectric constant (low k) layer comprises seasoning a chamber by exposing the inside of the chamber to a first mixture comprising one or more organosilicon compounds and one or more oxidizing gases in the presence of RF power to deposit a seasoning layer on one or more interior surfaces of the chamber, and depositing a low dielectric constant layer on a substrate in the chamber by reacting a second mixture comprising one or more organosilicon compounds and one or more oxidizing gases in the presence of RF power, wherein a ratio of a total flow rate of the one or more organosilicon compounds of the first mixture into the chamber to a total flow rate of the one or more oxidizing gases of the first mixture into the chamber is lower than a ratio of a total flow rate of the one or more organosilicon compounds of the second mixture into the chamber to a total flow rate of the one or more oxidizing gases of the second mixture into the chamber. The seasoning layer deposited on one or more interior surfaces of the chamber has a higher oxygen content than the low dielectric constant layer deposited on a substrate in the chamber.

In another embodiment, a method for seasoning a chamber and depositing a low dielectric constant layer comprises seasoning a chamber by exposing the inside of the chamber to a first mixture comprising one or more organosilicon compounds and one or more oxidizing gases in the presence of RF power to deposit a seasoning layer comprising about 5 atomic % or less carbon on one or more interior surfaces of the chamber, and depositing a low dielectric constant layer comprising greater than about 5 atomic. % carbon on a substrate in the chamber by reacting a second mixture comprising one or more organosilicon compounds and one or more oxidizing gases in the presence of RF power.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
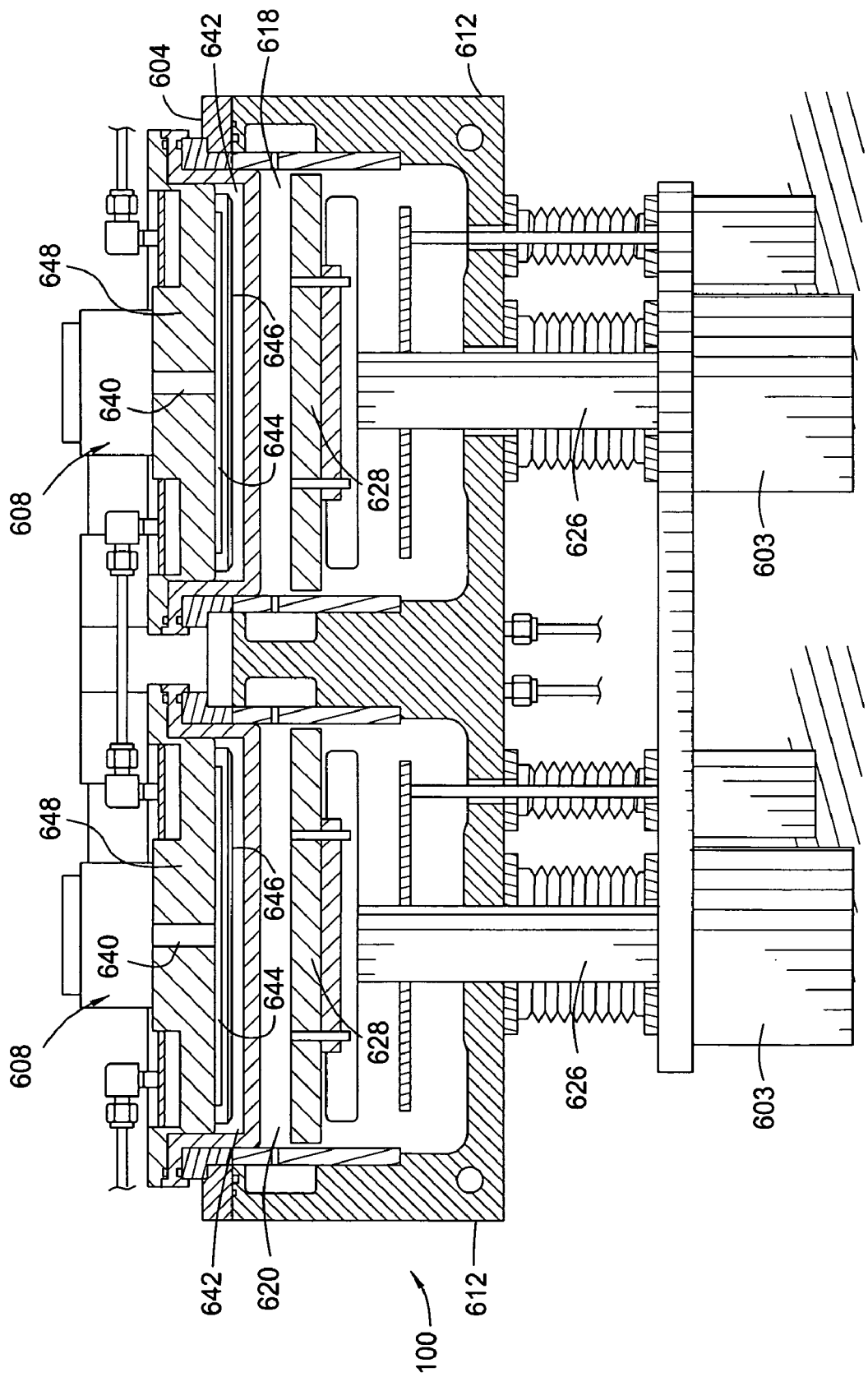
FIG. 1 is a cross sectional view of one embodiment of a deposition chamber.

Embodiments of the present invention provide a method of seasoning a chamber that reduces the generation of contaminating particles from the seasoning layer deposited on one or more interior surfaces of the chamber. The seasoning layer is deposited is under conditions sufficient to provide the seasoning layer with a different composition than a layer deposited on a substrate in the chamber in a deposition process performed in the chamber following the chamber seasoning. For example, in one embodiment, the seasoning layer comprises silicon, oxygen, and about 5 atomic % or less carbon, while the layer deposited on the substrate after the seasoning comprises silicon, oxygen, and greater than about 5 atomic % carbon. The carbon content of the deposited layers refers to an elemental analysis of the film structure. As defined herein, the carbon content in atomic % carbon is represented by the percent of carbon atoms in the deposited layer, excluding hydrogen atoms, which are difficult to quantify. For example, a layer having an average of one silicon atom, one oxygen atom, one carbon atom and two hydrogen atoms has a carbon content of 33 atomic percent excluding hydrogen atoms (one carbon atom per three total atoms).

The seasoning layer is deposited by exposing one or more interior surfaces of a chamber to a mixture comprising one or more organosilicon compounds and one or more oxidizing gases in the presence of RF power. After the seasoning layer is deposited, a substrate is introduced into the chamber, and a low dielectric constant layer is deposited on the substrate. The low dielectric constant layer has a dielectric constant of less than about 4 and is deposited from a mixture comprising one or more organosilicon compounds and one or more oxidizing gases in the presence of RF power. The one or more organosilicon compounds used to deposit the low dielectric constant layer may be the same or different than the one or more organosilicon compounds used to deposit the seasoning layer. Also, the one or more oxidizing gases used to deposit the low dielectric constant layer may be the same or different than the one or more oxidizing gases used to deposit the seasoning layer. Preferably, the one or more organosilicon compounds and the one or more oxidizing gases used to deposit the seasoning layer are the same as the one or more organosilicon compounds and the one or more oxidizing compounds used to deposit the low dielectric constant layer. Thus, a mixture of the same compounds may be used to deposit the seasoning layer and the low dielectric constant layer.

In one embodiment, a seasoning layer having a higher oxygen content and a lower carbon content than the low dielectric constant layer subsequently deposited on the substrate in the chamber is deposited on one or more interior surfaces of the chamber by exposing the inside of the chamber to a first mixture comprising one or more organosilicon compounds and one or more oxidizing gases in the presence of RF power at a ratio X of a total flow rate of the one or more organosilicon compounds to a total flow rate of the one or more oxidizing gases. The low dielectric constant layer is deposited on the substrate by reacting a second mixture comprising one or more organosilicon compounds and one or more oxidizing gases in the presence of RF power at a ratio Y of a total flow rate of the one or more organosilicon compounds to a total flow rate of the one or more oxidizing gases, wherein ratio X is less than ratio Y. To achieve a ratio X less than ratio Y, a lower total flow rate of one or more oxidizing gases may be used for depositing the low dielectric constant layer than for depositing the seasoning layer. Alternatively, or additionally, a higher total flow rate of one or more organosilicon compounds may be used for depositing the low dielectric constant layer than for depositing the seasoning layer.

In one embodiment, the seasoning layer is deposited from a gas mixture comprising one or more organosilicon compounds and one or more oxidizing gases, wherein the ratio of a total flow rate of the one or more organosilicon compounds into the chamber to a total flow rate of the one or more oxidizing gases into the chamber is between about 1:2 and about 1:4, preferably between about 1:2 and about 1:3. The low dielectric constant layer may be deposited from a gas mixture comprising one or more organosilicon compounds and one or more oxidizing gases, wherein the ratio of a total flow rate of the one or more organosilicon compounds into the chamber to a total flow rate of the one or more oxidizing gases into the chamber is between about 1:0.5 and about 1:0.7. The ratios of the total flow rates are chosen such that the ratio used to deposit the seasoning layer is less than the ratio used to deposit the low dielectric constant layer.

The one or more organosilicon compounds used to deposit the seasoning layer and the one or more organosilicon compounds used to deposit the low dielectric constant layer may be organosilanes, organosiloxanes, or combinations thereof. The term "organosilicon compound" as used herein is intended to refer to compounds containing carbon atoms in organic groups, and can be cyclic or linear. Organic groups may include alkyl, alkenyl, cyclohexenyl, and aryl groups in addition to functional derivatives thereof. Preferably, the organosilicon compounds include one or more carbon atoms attached to a silicon atom such that the carbon atoms are not readily removed by oxidation at suitable processing conditions. The organosilicon compounds may also preferably include one or more oxygen atoms. In one aspect, preferred oxygen-containing organosilicon compounds have an oxygen to silicon atom ratio of at least 1:1, and more preferably about 2:1.

Suitable cyclic organosilicon compounds include a ring structure having three or more silicon atoms, and optionally one or more oxygen atoms. Commercially available cyclic organosilicon compounds include rings having alternating silicon and oxygen atoms with one or two alkyl groups bonded to the silicon atoms. Some exemplary cyclic organosilicon compounds include:

| | |
|---|---|
| 1,3,5-trisilano-2,4,6-trimethylene, | —(—SiH$_2$CH$_2$—)$_3$— (cyclic) |
| 1,3,5,7-tetramethylcyclotetrasiloxane (TMCTS), | —(—SiHCH$_3$—O—)$_4$— (cyclic) |
| octamethylcyclotetrasiloxane (OMCTS), | —(—Si(CH$_3$)$_2$—O—)$_4$— (cyclic) |
| 1,3,5,7,9-pentamethylcyclopentasiloxane, | —(—SiHCH$_3$—O—)$_5$— (cyclic) |
| 1,3,5,7-tetrasilano-2,6-dioxy-4,8-dimethylene, | —(—SiH$_2$—CH$_2$—SiH$_2$—O—)$_2$— (cyclic) |
| hexamethylcyclotrisiloxane | —(—Si(CH$_3$)$_2$—O—)$_3$— (cyclic). |

Suitable linear organosilicon compounds include aliphatic organosilicon compounds having linear or branched structures with one or more silicon atoms and one or more carbon atoms. The organosilicon compounds may further include one or more oxygen atoms. Some exemplary linear organosilicon compounds include:

| | |
|---|---|
| methylsilane, | CH$_3$—SiH$_3$ |
| dimethylsilane, | (CH$_3$)$_2$—SiH$_2$ |
| trimethylsilane, | (CH$_3$)$_3$—SiH |
| ethylsilane, | CH$_3$—CH$_2$—SiH$_3$ |
| disilanomethane, | SiH$_3$—CH$_2$—SiH$_3$ |

-continued

| | |
|---|---|
| bis(methylsilano)methane, | $CH_3-SiH_2-CH_2-SiH_2-CH_3$ |
| 1,2-disilanoethane, | $SiH_3-CH_2-CH_2-SiH_3$ |
| 1,2-bis(methylsilano)ethane, | $CH_3-SiH_2-CH_2-CH_2-SiH_2-CH_3$ |
| 2,2-disilanopropane, | $SiH_3-C(CH_3)_2-SiH_3$ |
| diethylsilane, | $(C_2H_5)_2-SiH_2$ |
| propylsilane, | $C_3H_7-SiH_3$ |
| vinylmethylsilane, | $(CH_2=CH)-CH_3-SiH_2$ |
| 1,1,2,2-tetramethyldisilane, | $(CH_3)_2-SiH-SiH-(CH_3)_2$ |
| hexamethyldisilane, | $(CH_3)_3-Si-Si-(CH_3)_3$ |
| 1,1,2,2,3,3-hexamethyltrisilane, | $(CH_3)_2-SiH-Si(CH_3)_2-SiH-(CH_3)_2$ |
| 1,1,2,3,3-pentamethyltrisilane, | $(CH_3)_2-SiH-SiH(CH_3)-SiH-(CH_3)_2$ |
| 1,3-bis(methylsilano)propane, | $CH_3-SiH_2-(CH_2)_3-SiH_2-CH_3$ |
| 1,2-bis(dimethylsilano)ethane, | $(CH_3)_2-SiH-(CH_2)_2-SiH-(CH_3)_2$ |
| 1,3-bis(dimethylsilano)propane, | $(CH_3)_2-Si-(CH_2)_3-Si-(CH_3)_2$ |
| diethoxymethylsilane (DEMS), | $CH_3-SiH-(O-CH_2-CH_3)_2$ |
| 1,3-dimethyldisiloxane, | $CH_3-SiH_2-O-SiH_2-CH_3$ |
| 1,1,3,3-tetramethyldisiloxane, | $(CH_3)_2-SiH-O-SiH-(CH_3)_2$ |
| hexamethyldisiloxane (HMDS), | $(CH_3)_3-Si-O-Si-(CH_3)_3$ |
| 1,3-bis(silanomethylene)disiloxane, | $(SiH_3-CH_2-SiH_2-)_2-O$ |
| bis(1-methyldisiloxanyl)methane, | $(CH_3-SiH_2-O-SiH_2-)_2-CH_2$ |
| 2,2-bis(1-methyldisiloxanyl)propane, | $(CH_3-SiH_2-O-SiH_2-)_2-C(CH_3)_2$ |
| dimethyldimethoxysilane (DMDMOS), | $(CH_3O)_2-Si-(CH_3)_2$ |
| dimethoxymethylvinylsilane (DMMVS), | $(CH_3O)_2-Si-(CH_3)-CH_2=CH_3$. |

Oxidizing gases that may be used include oxygen ($O_2$), ozone ($O_3$), nitrous oxide ($N_2O$), carbon monoxide (CO), carbon dioxide ($CO_2$), water ($H_2O$), 2,3-butane dione, or combinations thereof. When ozone is used as an oxidizing gas, an ozone generator converts from 6% to 20%, typically about 15%, by weight of the oxygen in a source gas to ozone, with the remainder typically being oxygen. However, the ozone concentration may be increased or decreased based upon the amount of ozone desired and the type of ozone generating equipment used. Disassociation of oxygen or the oxygen containing compounds may occur in a microwave chamber prior to entering the deposition chamber to reduce excessive dissociation of the silicon containing compounds. Preferably, radio frequency (RF) power is applied to the reaction zone to increase dissociation.

Optionally, in addition to the one or more organosilicon compounds and the one or more oxidizing gases used to deposit the seasoning layer and the low dielectric constant layer, one or more hydrocarbon compounds may be included in the mixtures for depositing the seasoning layer and the low dielectric constant layer. Hydrocarbon compounds that may be used include aliphatic hydrocarbon compounds having between one and about 20 adjacent carbon atoms. The hydrocarbon compounds can include adjacent carbon atoms that are bonded by any combination of single, double, and triple bonds. For example, the organic compounds may include alkenes and alkylenes having two to about 20 carbon atoms, such as ethylene, propylene, acetylene, and butadiene.

One or more hydrocarbon compounds having a cyclic group may also be used. The term "cyclic group" as used herein is intended to refer to a ring structure. The ring structure may contain as few as three atoms. The atoms may include carbon, silicon, nitrogen, oxygen, fluorine, and combinations thereof, for example. The cyclic group may include one or more single bonds, double bonds, triple bonds, and any combination thereof. For example, a cyclic group may include one or more aromatics, aryls, phenyls, cyclohexanes, cyclohexadienes, cycloheptadienes, and combinations thereof. The cyclic group may also be bi-cyclic or tri-cyclic. Further, the cyclic group is preferably bonded to a linear or branched functional group. The linear or branched functional group preferably contains an alkyl or vinyl alkyl group and has between one and twenty carbon atoms. The linear or branched functional group may also include oxygen atoms, such as in a ketone, ether, and ester. Some exemplary compounds having at least one cyclic group include alpha-terpinene (ATP), vinylcyclohexane (VCH), and phenylacetate.

Optionally, one or more carrier gases may be included in the mixtures used to deposit the seasoning layer and/or the low dielectric constant layer. Carrier gases that may be used include argon, helium, and combinations thereof.

The deposition of the seasoning layer and the deposition of the low dielectric constant layer are preferably plasma enhanced processes. In a plasma enhanced process, a controlled plasma is typically formed adjacent the substrate support by RF energy applied to the gas distribution manifold of the deposition chamber using a RF power supply. Alternatively, RF power can be provided to the substrate support. The RF power to the deposition chamber may be cycled or pulsed to reduce heating of the substrate and promote greater porosity in the deposited film. The power density of the plasma for a 200 or 300 mm substrate is between about 0.03 W/cm$^2$ and about 3.2 W/cm$^2$, which corresponds to a RF power level of about 10 W to about 1,000 W for a 200 mm substrate and about 20 W to about 2,250 W for a 300 mm substrate.

The RF power supply can supply a single frequency RF power between about 0.01 MHz and 300 MHz. Preferably, the RF power may be delivered using mixed, simultaneous frequencies to enhance the decomposition of reactive species introduced into a high vacuum region of the chamber. In one aspect, the mixed frequency is a lower frequency of about 12 kHz and a higher frequency of about 13.56 MHz. In another aspect, the lower frequency may range between about 300 Hz to about 1,000 kHz, and the higher frequency may range between about 5 MHz and about 50 MHz.

The processing conditions for the deposition of the seasoning, layer and the low dielectric constant layer, such as the power level, pressure, and temperature, may be the same or different during the deposition of the seasoning layer and the low dielectric constant layer.

In one embodiment, during deposition of the seasoning layer, high frequency power at 13.56 MHz is provided at a power level between about 600 W and about 1100 W and low frequency power at 360 kHz is provided at a power level between about 0 W and about 100 W. An oxidizing gas is introduced into the chamber at a flow rate between about 900 sccm and about 1300 sccm. An organosilicon compound is introduced into the chamber at a flow rate between about 300 sccm and about 550 sccm. A carrier gas is introduced into the chamber at a flow rate between about 400 sccm and about 500 sccm. During deposition of the low dielectric constant layer, high frequency power at 13.56 MHz is provided at a power level between about 600 W and about 1100 W and low frequency power at 360 kHz is provided at a power level between about 0 W and about 100 W. An oxidizing gas is introduced into the chamber at a flow rate between about 400 sccm and about 500 sccm. An organosilicon compound is introduced into the chamber at a flow rate between about 800 sccm and about 1000 sccm. A carrier gas is introduced into the chamber at a flow rate between about 400 sccm and about 500 sccm.

In any of the embodiments described herein, during deposition of the seasoning layer and the low dielectric constant layer the chamber is maintained at a temperature between about −20° C. and about 500° C., preferably between about 100° C. and about 450° C. The deposition pressure is typically between about 1 Torr and about 20 Torr, preferably between about 2 Torr and about 5 Torr. An exemplary chamber that may be seasoned and used to deposit a low dielectric constant layer according to embodiments described herein is provided below.

The Producer® SE CVD chamber (200 mm or 300 mm), available from Applied Materials, Inc. of Santa Clara, Calif., has two isolated processing regions that may be used to deposit carbon-doped silicon oxides and other materials. A chamber having two isolated processing regions is described in U.S. Pat. No. 5,855,681, which is incorporated by reference herein. FIG. 1 shows a cross sectional view of a Producer® SE CVD chamber 100. The chamber 100 has processing regions 618 and 620. A heater pedestal 628 is movably disposed in each processing region 618, 620 by a stem 626 which extends through the bottom of the chamber body 612 where it is connected to a drive system 603. Each of the processing regions 618, 620 also preferably include a gas distribution assembly 608 disposed through the chamber lid 604 to deliver gases into the processing regions 618, 620. The gas distribution assembly 608 of each processing region also includes a gas inlet passage 640 which delivers gas into a shower head assembly 642. The showerhead assembly 642 is comprised of an annular base plate 648 having a blocker plate 644 disposed intermediate a face plate 646. An RF (radio frequency) feedthrough provides a bias potential to the showerhead assembly to facilitate generation of a plasma between the face plate 646 of the showerhead assembly and the heater pedestal 628.

The seasoning layers and the low dielectric constant layers described herein may be deposited using a computer storage medium containing a software routine that, when executed, causes a general purpose computer to control a deposition chamber. The software routine may comprise instructions for depositing any of the layers according to any of the embodiments described herein. An example of a deposition process performed according to one embodiment of a computer storage medium containing such a software routine is summarized in FIG. 2.

Figure 2:
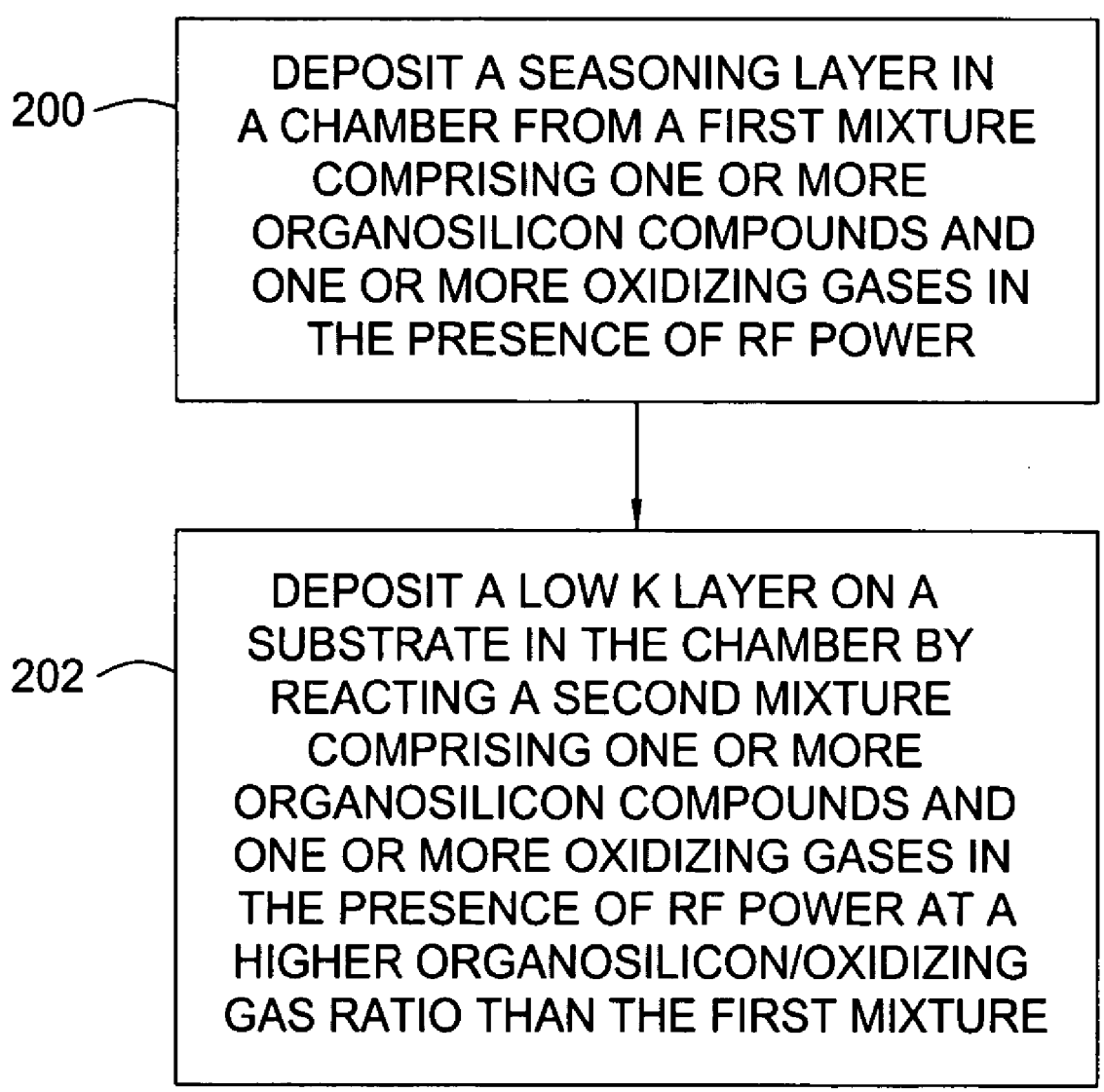
FIG. 2 is an illustrative flow chart of processes performed by a computer system in an embodiment.

A chamber is seasoned by exposing the inside of the chamber to a first mixture comprising one or more organosilicon compounds and one or more oxidizing gases in the presence of RF power to deposit a seasoning layer on one or more interior surfaces of the chamber, as shown in step 200 of FIG. 2. A low dielectric constant (low k) layer is deposited on a substrate in the chamber by reacting a second mixture comprising one or more organosilicon compounds and one or more oxidizing gases in the presence of RF power at a higher organosilicon to oxidizing gas ratio than the organosilicon to oxidizing gas ratio used to deposit the seasoning layer, as shown in step 202 of FIG. 2.

Figure 3:
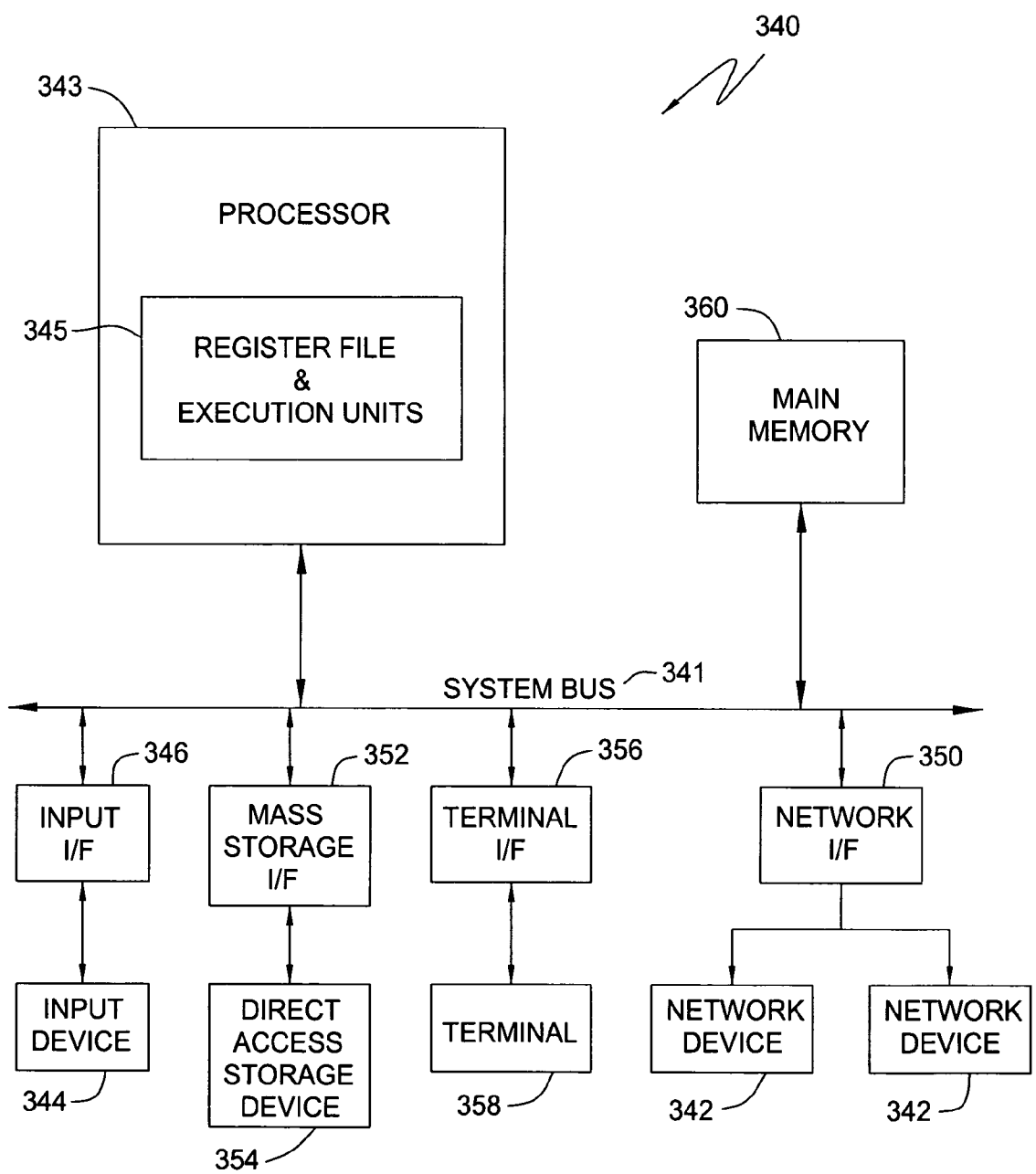
FIG. 3 is a computer system according to an embodiment.

An example of a computer system that may be used to execute the software routines described herein is shown in FIG. 3. Illustratively, the computer system 340 includes a system bus 341 and at least one processor 343 coupled to the system bus 341. The processor 343 includes register file and execution units 345. The computer system 340 also includes an input device 344 coupled to the system bus 341 via an input interface 346, a storage device 354 coupled to the system bus 341 via a mass storage interface 352, a terminal 358 coupled to the system bus 341 via a terminal interface 356, and a plurality of networked devices 342 coupled to the system bus 341 via a network interface 350.

Terminal 358 is any display device such as a cathode ray tube (CRT) or a plasma screen. Terminal 358 and networked devices 342 may be desktop or PC-based computers, workstations, network terminals, or other networked computer systems. Input device 344 can be any device to give input to the computer system 340. For example, a keyboard, keypad, light pen, touch screen, button, mouse, track ball, or speech recognition unit could be used. Further, although shown separately from the input device, the terminal 358 and input device 344 could be combined. For example, a display screen with an integrated touch screen, a display with an integrated keyboard or a speech recognition unit combined with a text speech converter could be used.

Storage device 354 is DASD (Direct Access Storage Device), although it could be any other storage such as floppy disc drives or optical storage. Although storage 354 is shown as a single unit, it could be any combination of fixed and/or removable storage devices, such as fixed disc drives, floppy disc drives, tape drives, removable memory cards, or optical storage. Main memory 360 and storage device 354 could be part of one virtual address space spanning multiple primary and secondary storage devices.

The contents of main memory 360 can be loaded from and stored to the storage device 354 as processor 343 has a need for it. Main memory 360 is any memory device sufficiently large to hold the necessary programming and data structures of the invention. The main memory 360 could be one or a combination of memory devices, including random access memory (RAM), non-volatile or backup memory such as programmable or flash memory or read-only memory (ROM). The main memory 360 may be physically located in another part of the computer system 340. While main memory 360 is shown as a single entity, it should be understood that memory 360 may in fact comprise a plurality of modules, and that main memory 360 may exist at multiple levels, from high speed registers and caches to lower speed but larger DRAM chips.

In general, the routines executed to implement the embodiments of the invention may be implemented as part of an operating system or a specific application, component, program, object, module or sequence of instructions and may be generally referred to as a "program". The inventive program typically comprises one or more instructions that are resident at various times in various memory and storage devices in a computer, and that, when read and executed by one or more processors in a computer, cause that computer to perform the steps necessary to execute steps or elements embodying the various aspects of the invention.

In addition, various programs and devices described herein may be identified based upon the application for which they are implemented in a specific embodiment of the invention. However, it should be appreciated that any particular program or device nomenclature that follows is used merely for convenience, and the invention is not limited to use solely in any specific application identified and/or implied by such nomenclature.

Moreover, while some embodiments have and hereinafter will be described in the context of fully functioning computers and computer systems, those skilled in the art will appreciate that the various embodiments of the invention are capable of being distributed as a program product in a variety of forms, and that embodiments of the invention apply equally regardless of the particular type of signal bearing media used to actually carry out the distribution. Examples of signal bearing media (also referred to herein as computer readable medium) include, but are not limited to, recordable type media such as volatile and nonvolatile memory devices, floppy and other removable disks, hard disk drives, optical disks (e.g., CD-ROMs, DVDs, etc.), controllers and transmission type media such as digital and analog communication links. Transmission type media include information conveyed to a computer by a communications medium, such as through a computer or telephone network, and includes wireless communications. The latter embodiment specifically includes information downloaded from the Internet and other networks. Such signal-bearing media, when carrying computer-readable instructions that direct the functions of the present invention, represent embodiments of the present invention.

The following examples illustrate a method of seasoning a chamber and depositing a low dielectric constant layer in the chamber. The low dielectric constant layers were deposited on 300 mm substrates in a Producer® SE CVD chamber.

EXAMPLES

Comparison Example 1

A seasoning layer was deposited on a substrate support pedestal of the chamber at about 6 Torr and a chamber temperature of about 335° C. The following processing gases and flow rates were used:
  Trimethylsilane, at 900 sccm;
  Oxygen, at 600 sccm; and
  Helium, at 450 sccm.
A power level of 1000 W at a frequency of 13.56 MHz was applied to the showerhead for plasma enhanced deposition. There was a spacing of 600 mils between the chamber showerhead and the substrate. The seasoning layer included silicon, oxygen, and carbon-hydrogen bonds, according to FTIR analysis. Potentially contaminating particles protruding from the seasoning layer on the chamber face plate were detected.

A low dielectric constant layer was deposited on a substrate in the chamber after the chamber seasoning. The low dielectric constant layer was deposited at about 3.5 Torr and a chamber temperature of about 335° C. A power level of 600 W at a frequency of 13.56 MHz and a power level of 80 W at a frequency of 360 kHz were applied in the chamber for plasma enhanced deposition. The following processing gases and flow rates were used:
  Trimethylsilane, at 900 sccm;
  Oxygen, at 660 sccm; and
  Argon, at 450 sccm.

Example 1

A seasoning layer was deposited on a substrate support pedestal of the chamber at about 3.5 Torr and a chamber temperature of about 335° C. The following processing gases and flow rates were used:
  Trimethylsilane, at 500 sccm;
  Oxygen, at 1060 sccm; and
  Helium, at 450 sccm.
A power level of 600 W at a frequency of 13.56 MHz and a power level of 80 W at a frequency of 360 kHz were applied in the chamber for plasma enhanced deposition. There was a spacing of 600 mils between the chamber showerhead and the substrate. The deposited seasoning layer had a thickness of 2826 Å, a refractive index of 1.431, and a compressive stress of −29 MPa. The seasoning layer included silicon, oxygen, and a low amount of carbon-hydrogen bonds, according to FTIR analysis. Potentially contaminating particles protruding from the seasoning layer on the chamber face plate were not detected.

A low dielectric constant layer was deposited on a substrate in the chamber after the chamber seasoning. The low dielectric constant layer was deposited at about 3.5 Torr and a chamber temperature of about 335° C. A power level of 600 W at a frequency of 13.56 MHz and a power level of 80 W at a frequency of 360 kHz were applied in the chamber for plasma enhanced deposition. There was a spacing of 600 mils between the chamber showerhead and the substrate. The following processing gases and flow rates were used:
  Trimethylsilane, at 900 sccm;
  Oxygen, at 660 sccm; and
  Argon, at 450 sccm.

Example 2

A seasoning layer was deposited on a substrate support pedestal of the chamber at about 3.5 Torr and a chamber temperature of about 335° C. The following processing gases and flow rates were used:
  Trimethylsilane, at 500 sccm;
  Oxygen, at 1060 sccm; and
  Helium, at 450 sccm.
A power level of 1000 W at a frequency of 13.56 MHz and a power level of 80 W at a frequency of 360 kHz were applied in the chamber for plasma enhanced deposition. There was a spacing of 600 mils between the chamber showerhead and the substrate. The deposited seasoning layer had a thickness of 2671 Å, a refractive index of 1.449, and a compressive stress of −55 MPa. The seasoning layer included silicon, oxygen, and a low amount of carbon-hydrogen bonds, according to FTIR analysis. Potentially contaminating particles protruding from the seasoning layer on the chamber face plate were not detected.

A low dielectric constant layer was deposited on a substrate in the chamber after the chamber seasoning. The low dielectric constant layer was deposited at about 3.5 Torr and a chamber temperature of about 335° C. A power level of 600 W at a frequency of 13.56 MHz and a power level of 80 W at a frequency of 360 kHz were applied in the chamber for plasma enhanced deposition. There was a spacing of 600 mils between the chamber showerhead and the substrate. The following processing gases and flow rates were used:
  Trimethylsilane, at 900 sccm;
  Oxygen, at 660 sccm; and
  Argon, at 450 sccm.

Example 3

A seasoning layer was deposited on a substrate support pedestal of the chamber at about 3.5 Torr and a chamber temperature of about 335° C. The following processing gases and flow rates were used:
Trimethylsilane, at 390 sccm;
Oxygen, at 1170 sccm; and
Helium, at 450 sccm.

A power level of 600 W at a frequency of 13.56 MHz and a power level of 80 W at a frequency of 360 kHz were applied in the chamber for plasma enhanced deposition. There was a spacing of 600 mils between the chamber showerhead and the substrate. The deposited seasoning layer had a thickness of 1767 Å, a refractive index of 1.460, and a compressive stress of −48 MPa. The seasoning layer included silicon, oxygen, and a low amount of carbon-hydrogen bonds, according to FTIR analysis. Potentially contaminating particles protruding from the seasoning layer on the chamber face plate were not detected.

A low dielectric constant layer was deposited on a substrate in the chamber after the chamber seasoning. The low dielectric constant layer was deposited at about 3.5 Torr and a chamber temperature of about 335° C. A power level of 600 W at a frequency of 13.56 MHz and a power level of 80 W at a frequency of 360 kHz were applied in the chamber for plasma enhanced deposition. There was a spacing of 600 mils between the chamber showerhead and the substrate. The following processing gases and flow rates were used:
Trimethylsilane, at 900 sccm;
Oxygen, at 660 sccm; and
Argon, at 450 sccm.

Analysis of the seasoning layers deposited on the chamber interior surfaces revealed that the seasoning layers deposited in Examples 1–3 have higher oxygen contents than seasoning layers deposited from a mixture having a higher organosilicon compound/oxidizing gas flow rate ratios, e.g., the seasoning layer deposited in Comparison Example 1.

The seasoning layers deposited according to embodiments described herein had refractive indices of about 1.40 to about 1.46, e.g., between about 1.43 and about 1.46, indicating that the seasoning layers were oxide-like, as the refractive index of silicon oxide is approximately 1.46.

The seasoning layers deposited according to embodiments described herein had fewer potentially contaminating particles protruding from the seasoning layer than seasoning layers deposited from gas mixtures having the same organosilicon compound/oxidizing gas flow rate ratio used to deposit a low dielectric constant film on a substrate in the chamber, i.e., seasoning layers deposited a higher organosilicon compound/oxidizing gas flow rate ratio.

It is believed that the oxide-like seasoning layers described herein having compressive stress are less likely to crack and form contaminating particles in the chamber than films having high tensile stress, which can lead to film bowing or deformation, film cracking or film peeling.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
    seasoning a chamber by exposing the inside of the chamber to a first mixture comprising one or more organosilicon compounds and one or more oxidizing gases in the presence of RF power to deposit a seasoning layer on one or more interior surfaces of the chamber; and
    depositing a low dielectric constant layer on a substrate in the chamber by reacting a second mixture comprising one or more organosilicon compounds and one or more oxidizing gases in the presence of RF power, wherein a ratio of a total flow rate of the one or more organosilicon compounds of the first mixture into the chamber to a total flow rate of the one or more oxidizing gases of the first mixture into the chamber is lower than a ratio of a total flow rate of the one or more organosilicon compounds of the second mixture into the chamber to a total flow rate of the one or more oxidizing gases of the second mixture into the chamber.

2. The method of claim 1, wherein the one or more oxidizing gases of the first mixture and the one or more oxidizing gases of the second mixture are selected from the group consisting of oxygen, ozone, nitrous oxide, carbon monoxide, carbon dioxide, 2,3-butane dione, and combinations thereof.

3. The method of claim 1, wherein the one or more organosilicon compounds of the first mixture and the one or more organosilicon compounds of the second mixture are the same.

4. The method of claim 1, wherein the one or more organosilicon compounds of the first mixture and the one or more organosilicon compounds of the second mixture are different.

5. The method of claim 1, wherein the ratio of a total flow rate of the one or more organosilicon compounds of the first mixture into the chamber to a total flow rate of the one or more oxidizing gases of the first mixture into the chamber is between about 1:2 and about 1:4.

6. The method of claim 1, wherein the one or more organosilicon compounds of the first mixture and the one or more organosilicon compounds of the second mixture consist of trimethylsilane, and the one or more oxidizing gases of the first mixture and the one or more oxidizing gases of the second mixture consist of oxygen.

7. The method of claim 1, wherein the seasoning layer has a refractive index of between about 1.43 and about 1.46.

8. The method of claim 1, wherein the seasoning layer has compressive stress.

9. A method for processing a substrate, comprising:
    seasoning a chamber by exposing the inside of the chamber to a first mixture comprising one or more organosilicon compounds and one or more oxidizing gases in the presence of RF power to deposit a seasoning layer comprising about 5 atomic % or less carbon on one or more interior surfaces of the chamber; and
    depositing a low dielectric constant layer comprising greater than about 5 atomic % carbon on a substrate in the chamber by reacting a second mixture comprising one or more organosilicon compounds and one or more oxidizing gases in the presence of RF power.

10. The method of claim 9, wherein the one or more oxidizing gases of the first mixture and the one or more oxidizing gases of the second mixture are selected from the group consisting of oxygen, ozone, nitrous oxide, carbon monoxide, carbon dioxide, 2,3-butane dione, and combinations thereof.

11. The method of claim 9, wherein a ratio of a total flow rate of the one or more organosilicon compounds of the first mixture into the chamber to a total flow rate of the one or more oxidizing gases of the first mixture into the chamber is lower than a ratio of a total flow rate of the one or more organosilicon compounds of the second mixture into the chamber to a total flow rate of the one or more oxidizing gases of the second mixture into the chamber.

12. The method of claim 9, wherein the ratio of a total flow rate of the one or more organosilicon compounds of the first mixture into the chamber to a total flow rate of the one or more oxidizing gases of the first mixture into the chamber is between about 1:2 and about 1:4.

13. The method of claim 9, wherein the seasoning layer has compressive stress.

14. The method of claim 9, wherein the one or more organosilicon compounds of the first mixture and the one or more organosilicon compounds of the second mixture consist of trimethylsilane, and the one or more oxidizing gases of the first mixture and the one or more oxidizing gases of the second mixture consist of oxygen.

* * * * *

UNITED STATES PATENT AND TRADEMARK OFFICE
CERTIFICATE OF CORRECTION

| | |
|---|---|
| PATENT NO. | : 7,115,508 B2 |
| APPLICATION NO. | : 10/816606 |
| DATED | : October 3, 2006 |
| INVENTOR(S) | : Park et al. |

It is certified that error appears in the above-identified patent and that said Letters Patent is hereby corrected as shown below:

Column 2, Line 30: Delete the period after "atomic"

Column 2, Line 59: After "deposited", delete "is"

Column 5, Line 9: In the Table, change "$(CH_3)_3$—Si—Si—$(CH_3)_3$" to --$(CH_3)_3$—Si—Si—$(CH_3)_3$--

Column 6, Line 61: Delete the comma after "seasoning"

Column 9, Line 9: After "have", insert --been--

Signed and Sealed this

Second Day of January, 2007

JON W. DUDAS
*Director of the United States Patent and Trademark Office*